(12) United States Patent
Kamata et al.

(10) Patent No.: US 6,639,333 B1
(45) Date of Patent: Oct. 28, 2003

(54) LINEAR MOTOR STAGE SYSTEM FOR USE IN EXPOSURE APPARATUS

(75) Inventors: Shigeto Kamata, Yokohama (JP); Toshio Matsuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/619,665

(22) Filed: Jul. 19, 2000

(30) Foreign Application Priority Data

Jul. 19, 1999 (JP) .......................... 11-204974

(51) Int. Cl.$^7$ .................... H02K 41/02; H02K 9/00
(52) U.S. Cl. .................. 310/12; 310/58; 310/60 A; 250/492.2
(58) Field of Search ............ 414/935; 250/492.2; 310/12, 13, 14, 58, 60 A

(56) References Cited

U.S. PATENT DOCUMENTS

| | | | |
|---|---|---|---|
| 5,783,877 A | * | 7/1998 | Chitayat ................ 310/12 |
| 6,025,658 A | | 2/2000 | Kamata ................ 310/12 |
| 6,043,572 A | | 3/2000 | Nagai et al. ............ 310/12 |
| 6,084,319 A | | 7/2000 | Kamata et al. .......... 310/10 |
| 6,140,734 A | * | 10/2000 | Hazelton et al. ........ 310/12 |
| 6,252,314 B1 | * | 6/2001 | Ebinuma ............... 310/12 |

FOREIGN PATENT DOCUMENTS

| | | | |
|---|---|---|---|
| JP | 10-127035 | 5/1998 | .......... H02K/41/02 |
| JP | 10-309071 | 11/1998 | .......... H02K/41/02 |

* cited by examiner

*Primary Examiner*—Burton Mullins
(74) *Attorney, Agent, or Firm*—Fitzpatrick, Cella, Harper & Scinto

(57) ABSTRACT

A linear motor includes a magnet, a coil, and a jacket having an inside member that is comb-shaped having teeth, extending along a driving direction. The coil is engaged by the teeth of the comb-shaped member. A cooling medium flows through an inside space enclosed by the jacket. Unwanted deformation or breakage of the jacket can be avoided even if the pressure of the cooling medium is enlarged or the thickness of a small-thickness portion of the jacket is made smaller. A higher cooling efficiency is thus attainable by increasing the flow rate of the cooling medium.

22 Claims, 8 Drawing Sheets

LINEAR MOTOR STAGE SYSTEM FOR USE IN EXPOSURE APPARATUS

FIELD OF THE INVENTION AND RELATED ART

This invention relates to a linear motor and a stage system with the same, suitably usable in an apparatus such as a semiconductor exposure apparatus or a high precision processing machine wherein precise positioning is to be performed. The present invention also relates to an exposure apparatus and/or a device manufacturing method using such a linear motor or a stage system.

In an positioning system of nanometer order for use in a semiconductor exposure apparatus or a high precision processing machine, heat generation in a linear motor, which is a driving source, has an adverse influence on the positioning process. More specifically, the heat generation may cause thermal deformation of the structure of the machine and a temperature rise of air, which may result in a measurement error in a position measuring laser interferometer. It may also cause degradation of the positioning precision of the apparatus in which the linear motor is incorporated. For example, with a temperature rise of only 1° C., a low thermal expansion material (thermal expansion coefficient $1\times10^{-6}$) of a size 100 mm may deform by 100 nm. Also, with a change of only 1° C. or less in the temperature of air at the light path of an optical-interferometer distance gauge, an error of 100 nm may be produced in the measured value. In consideration of this, some measures should be taken to prevent such temperature change and, in this respect, a linear motor has to be cooled. Particularly, any heat produced from the linear motor should be collected.

On the other hand, in order to improve the performance of an apparatus, enlargement of the output power of a linear motor has been desired. If the electric current to be supplied to coils of the motor is made larger at this end, the amount of heat generation becomes larger. It requires enlargement of the cooling capacity. The enlargement of the cooling capacity is important also with respect to prevention of damage to the coil wires or an increase in coil resistance due to a coil temperature rise.

FIG. 15 is a sectional view of a structure of a conventional linear motor having cooling means. As illustrated, the linear motor comprises a coil 1 and permanent magnets 3 fixed to yokes 2 on the opposite sides of the coil 1. The coil 1 is surrounded by a jacket 9, which comprises thin sheets 4 and 4' and a frame 5. The coil 1 is fixed to the frame 5 by means of a fixing element 7. The jacket 9 is structured so that a cooling medium flows through an inside space 6 thereof, to collect heat produced at the coil 1.

FIG. 16 is a sectional view of a linear motor of another example. In this linear motor, an electric current flows through a coil 1 (lateral in 5 the drawing) disposed in a magnetic field (longitudinal in the drawing) produced by permanent magnets 3, which are fixed to yokes 2. In response to it, the coil 1 and the magnets 3 are relatively moved in a direction perpendicular to the sheet of the drawing. In order to collect heat produced from the coil 1, the coil 1 is enclosed by a jacket having portions 14 and 14'. A cooling medium flows through a clearance between the coil 1 and the jacket, by which the heat is collected. In order that the distance between the permanent magnets 3 is made smaller and the produced magnetic density is made larger for enlargement of the linear motor thrust, the jacket is made thin.

In these examples, however, if the flow rate of the cooling medium is made larger to increase the cooling capacity, the resultant pressure rise of the cooling medium may cause outward deformation of a small-thickness portion of the jacket. It may result in contact with the permanent magnet or breakage of the jacket. To avoid this, the small-thickness portion of the jacket should have a sufficient strength. To the contrary, to increase the output power of a linear motor, the distance between permanent magnets has to be made small to enlarge the magnetic density. In this respect, the small-thickness portion of the jacket should be made thin as much as possible to reduce the size of the jacket.

Further, in a case of a multiple-phase linear motor having coils being arrayed along a direction perpendicular to the sheet of the drawing of FIG. 16, the coil and jacket structure extends in a direction perpendicular to the sheet of the drawing. In this example, the natural frequency of the structure should be made large to reduce the adverse influence on a high-precision positioning system in which the linear motor is incorporated.

SUMMARY OF THE INVENTION

It is accordingly an object of the present invention to provide a linear motor structure and/or a stage system with the same wherein the thickness of a small-thickness portion can be kept small while the strength of the same is enlarged.

It is another object of the present invention to provide an invention to provide a linear motor structure and/or a stage system with the same wherein a coil and jacket structure has an enlarged natural vibration frequency.

It is a further object of the present invention to provide an exposure apparatus and/or a device manufacturing system that uses a linear motor structure or a stage system such as described above.

In accordance with an aspect of the present invention, there is provided a linear motor, comprising: a magnet; a coil; and a jacket having an inside comb-shaped member extending along a driving direction, wherein the coil is engaged by teeth of the comb-shaped member and wherein a cooling medium flows through an inside space enclosed by the jacket.

The comb-shaped member may include base portions provided on mutually opposed inside faces of the jacket and formed in parallel to the driving direction and to be opposed to each other, and a pillar-like portion for connecting the base portions, wherein the coil may be supported by said base portions in a floating manner while it may be held fixed by the pillar-like portion with respect to the driving direction.

The linear motor may include a plurality of coils arrayed along the driving direction partially overlapping each other, wherein each coil may have a bent end portion to avoid mutual interference of the partially overlapped portions of the coils, and wherein the coils may be disposed with their central portions placed substantially at the same level.

The jacket may have a central portion of a small thickness with an outside recessed portion, wherein the bent end portions of the coils may be disposed at the recessed portion, and wherein the central portion of small thickness may be reinforced by the recessed portion.

The jacket may serve as a guide for an element to be driven by the linear motor.

In accordance with another aspect of the present invention, there is provided a stage system, comprising: a movable stage; a linear motor having a magnet and a coil, for driving the stage; and a jacket having an inside member that is comb-shaped, extending along a driving direction, wherein the coil is engaged by teeth of the comb-shaped member and wherein a cooling medium flows through an inside space enclosed by the jacket.

In accordance with a further aspect of the present invention, there is provided an exposure apparatus, comprising: a movable stage for holding a substrate thereon; a linear motor having a magnet and a coil, for driving the stage; and a jacket having an inside member that is comb-shaped, extending along a driving direction, wherein the coil is engaged by teeth of the comb-shaped member and wherein a cooling medium flows through an inside space enclosed by the jacket.

In accordance with a yet further aspect of the present invention, there is provided a device manufacturing method, comprising the steps of: applying a photosensitive material onto a substrate; exposing the substrate by use of an exposure apparatus including a movable stage for holding a substrate thereon, a linear motor having a magnet and a coil, for driving the stage, and a jacket having an inside member that is comb shaped, extending along a driving direction, wherein the coil is engaged by teeth of the comb-shaped member and wherein a cooling medium flows through an inside space enclosed by the jacket; and developing the exposed substrate.

In accordance with a still further aspect of the present invention, there is provided a linear motor, comprising: a magnet; a coil; and a jacket having a reinforcement portion extending parallel to a driving direction, wherein the coil is enclosed by the jacket and wherein a cooling medium flows through an inside space of the jacket.

The reinforcement portion may be formed on an outside face of the jacket.

The reinforcement portion may be formed at a position not interfering with relative motion of the magnet and the coil.

The reinforcement portion may be made of one of aluminum, ceramics and resin.

The reinforcement portion may be made integral with the jacket, and the reinforcement portion may be defined by a portion having a protruded shape with respect to a level of a portion of the jacket where the magnet and the coil are opposed to each other.

The jacket and reinforcement portion being integral with each other may be made of one of ceramics and resin.

The protruded shape portion of the jacket may be defined by an inside recessed portion of the jacket where a portion of the coil is placed.

At least one of an upper half and a lower half of a section of the jacket taken along a plane perpendicular to the driving direction may have a recessed shape portion.

In accordance with another aspect of the present invention, there is provided a stage system, comprising: a movable stage; a linear motor having a magnet and a coil, for driving the stage; and a jacket having a reinforcement portion extending parallel to a driving direction, wherein the coil is enclosed by the jacket and wherein a cooling medium flows through an inside space of the jacket.

In accordance with a further aspect of the present invention, there is provided an exposure apparatus, comprising: a movable stage for holding a substrate thereon; a linear motor having a magnet and a coil, for driving the stage; and a jacket having a reinforcement portion extending parallel to a driving direction, wherein the coil is enclosed by the jacket and wherein a cooling medium flows through an inside space of said jacket.

In accordance with a yet further aspect of the present invention, there is provided a device manufacturing method, comprising the steps of: applying a photosensitive material onto a substrate; exposing the substrate by use of an exposure apparatus having a movable stage for holding a substrate thereon, a linear motor having a magnet and a coil, for driving the stage, and a jacket having a reinforcement portion extending in parallel to a driving direction, wherein the coil is enclosed by the jacket and wherein a cooling medium flows through an inside space of the jacket; and developing the exposed substrate.

The comb-shaped member or the reinforcement member functions to enlarge the strength of the jacket against the pressure of the cooling medium inside the jacket. Thus, even if the pressure of the cooling medium is made larger or the size of the jacket is made smaller, unwanted deformation or breakage of the jacket can be prevented. A linear motor with its output power enlarged as compared with conventional structures can be provided, such that a stage system, an exposure apparatus or a device manufacturing method using such a linear motor can also be provided.

The comb-shaped member or the reinforcement member is provided in an inside space of the linear motor. Therefore, without the need of enlargement in size of the linear motor, deformation or breakage of the jacket can be prevented and, on the other hand, the cooling efficiency can be improved. Further, the provision of the comb-shaped member or the reinforcement member effectively improves the rigidity of the jacket, the natural frequency of the jacket can be made higher. This effectively leads to improvements in precision of a precision positioning apparatus or precision machining apparatus wherein the linear motor is incorporated.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

Embodiment 1

Figure 1:
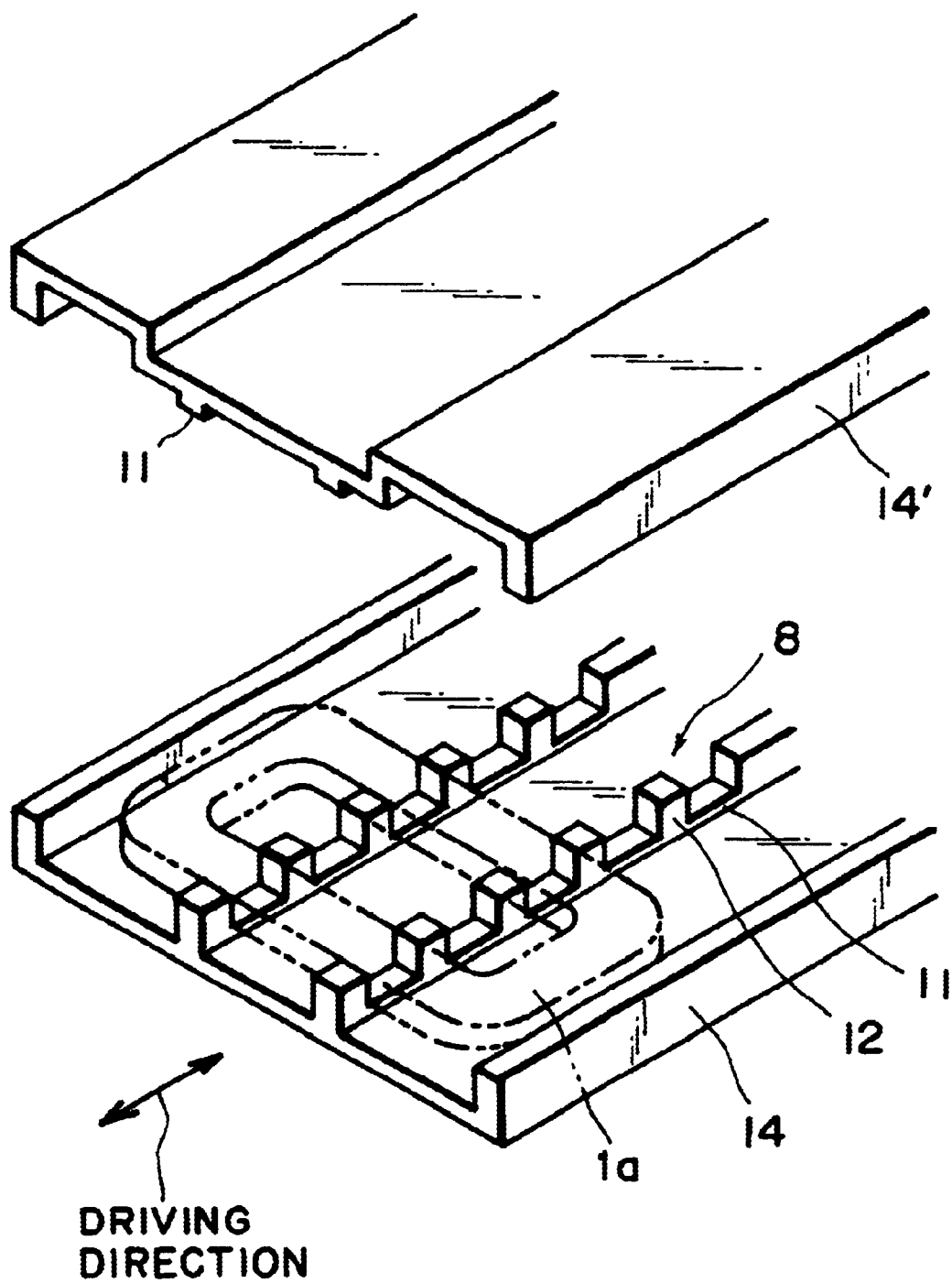
FIG. 1 is a perspective and exploded view of a jacket of a linear motor according to a first embodiment of the present invention.
Figure 2:
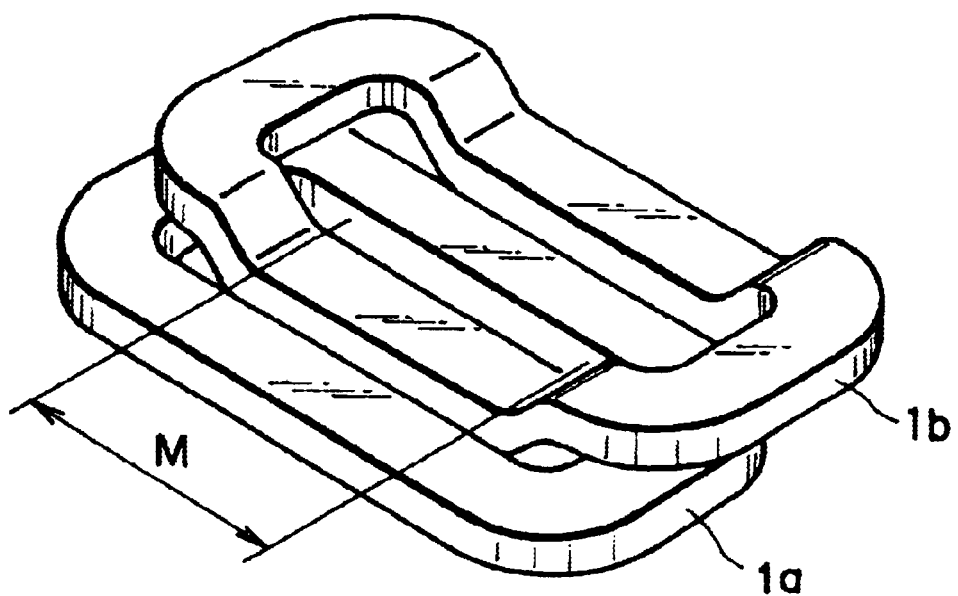
FIG. 2 is a perspective view of an example of a combination of coils to be disposed within the jacket of FIG. 1.
Figure 3:
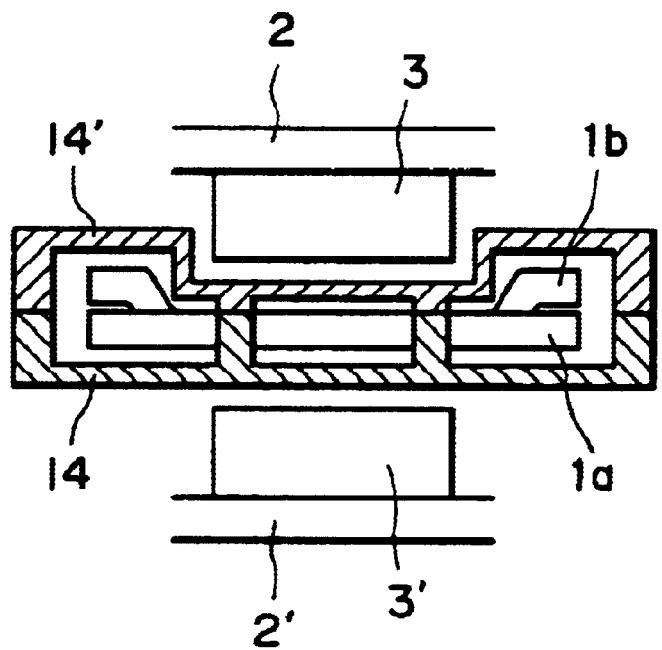
FIG. 3 is a sectional view of a linear motor with the jacket of FIG. 1, taken along a plane perpendicular to the driving direction.
Figure 4:
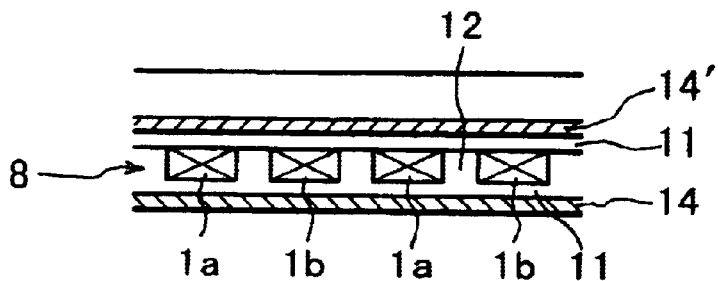
FIG. 4 is a sectional view of the linear motor of FIG. 1, taken along the driving direction.

FIG. 1 is a perspective and exploded view of a jacket of a linear motor according to a first embodiment of the present invention. FIG. 2 is a perspective view of an example of a combination of coils to be disposed within the jacket of FIG. 1. FIG. 3 is a sectional view of a linear motor with the jacket of FIG. 1, taken along a plane perpendicular to the driving direction. FIG. 4 is a sectional view of the linear motor of FIG. 1, taken along the driving direction. In these drawings, denoted at 1a is a flat coil, and denoted at 14 and 14' are jacket elements constituting a jacket. Denoted at 8 is a comb-shaped structure formed on the jacket elements 14 and 14'. The coil 1a through which an electric current flows is disposed inside the jacket defined by the jacket elements 14 and 14'. It is held fixed at recessed portions of the comb-shaped structure 8, defined by the jacket elements 14 and 14', by using an adhesive agent, for example. Denoted at 1b is a bent coil wherein, as shown in FIG. 2, a portion of the bent coil 1b is placed into a void core portion of the flat coil 1a. There are a plurality of coils, being paired such as shown in FIG. 2, which are arrayed and covered by the jacket. Although in FIG. 1 there is only a flat coil 1a illustrated, a bent coil 1b is provided there in the positional relation with the flat coil 1a as shown in FIG. 2. The comb-shaped structure 8 includes base portions 11 which are formed on the opposed inside faces of the jacket, along a direction parallel to the driving direction, so as to be opposed to each other, as well as pillar portions 12 connecting the opposed base portions. The base portions serve to support the coils 1a and 1b in a floating manner so that the coils float from the inside faces of the jacket. The pillar portions serve to hold the coils 1a and 1b fixed with respect to the driving direction.

In FIG. 3, denoted at 2 and 2' are yokes, and denoted at 3 and 3 are permanent magnets. A portion of the coils 1a and 1b is disposed in a magnetic field that is produced by a magnetic circuit defined by the permanent magnets 3 and 3' and yokes 2 and 2'. When an electric current flows through the coils 1a and 1b, the coils 1a and 1b and the permanent magnets 3 and 3' are relatively driven in opposite directions, along a direction perpendicular to the sheet of the drawing. In the portion of FIG. 3 where the magnetic field is produced (a region M in FIG. 2), a portion of the bent coil 1b is placed into the void core portion of the flat coil 1a. This effectively shortens the gap of the space where the magnetic field is produced. Therefore, it effectively increases the magnetic field. Further, since the opposite end portions of the bent coil 1b are bent upwardly above the flat coil 1a, the jacket element 14' is formed with an inside recessed portion corresponding to the shape of the coil.

As shown in FIG. 4, the portions of the coils 1a and 1b in the region where the magnetic field is produced are placed at the same level. The coils 1a and 1b are held fixed by the comb-shaped structure 8, and there are spaces defined between the jacket and the coils 1a and 1b. In FIG. 4, the magnetic circuit (permanent magnets and yokes) is not illustrated.

The jacket elements 14 and 14' are sealingly fixed to each other by means of an adhesive agent or bolts. A temperature controlled cooling medium flows through the space between the jacket and the coils 1a and 1b, to thereby collect heat generated by the coils 1a and 1b. With this arrangement, any temperature rise of the coils 1a and 1b themselves, as well as any temperature rise of a component mounted on the linear motor or of an environment thereof, can be prevented. The pillars 12 of the comb-shaped structure 8 formed on the jacket element 14 are fixed to the base portions 11 of the jacket element 14'. This effectively prevents outward deformation of the jacket by the inside pressure of the cooling medium. The recessed portion of the jacket 14' accommodating the opposite ends of the bent coil 1b serves to reinforce the small-thickness portion of the jacket where the magnetic field is applied.

In accordance with this embodiment, even if the pressure of the cooling medium is increased or the thickness of the jacket sheet is made smaller, unwanted deformation or breakage of the jacket can be prevented. Therefore, the flow rate of the cooling medium made larger to improve the cooling efficiency and also the jacket can be made compact. This leads to an improvement of the linear motor thrust.

Embodiment 2

Figure 5:
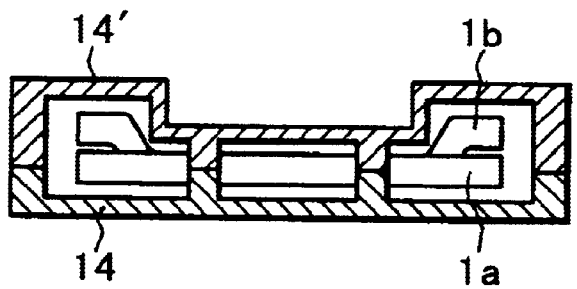
FIG. 5 is a sectional view of a jacket of a linear motor according to a second embodiment of the present invention, taken along a plane perpendicular to the driving direction.
Figure 6:
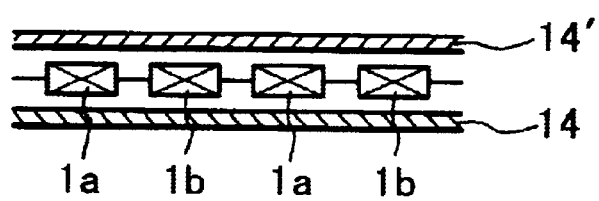
FIG. 6 is a sectional view of the linear motor of FIG. 5, taken along the driving direction.

FIG. 5 is a sectional view of a jacket of a linear motor according to a second embodiment of the present invention, taken along a plane perpendicular to the driving direction. FIG. 6 is a sectional view of the linear motor of FIG. 5, taken along the driving direction. In these drawing, a magnetic circuit (permanent magnets and yokes) is not illustrated. In the example of FIGS. 3 and 4, the connection face between the jacket elements 14 and 14' is at the same level as the upper surface of the coil 1a. In this embodiment, as compared therewith, the connection face is placed at the central portion of the coil 1a. In this manner, the contact face between the jacket elements 14 and 14' can be changed in the height direction in the drawing. The remaining potion of this embodiment has substantially the same structure and function as the first embodiment. Substantially the same advantageous results as of the first embodiment are attainable with this embodiment.

Embodiment 3

Figure 7:
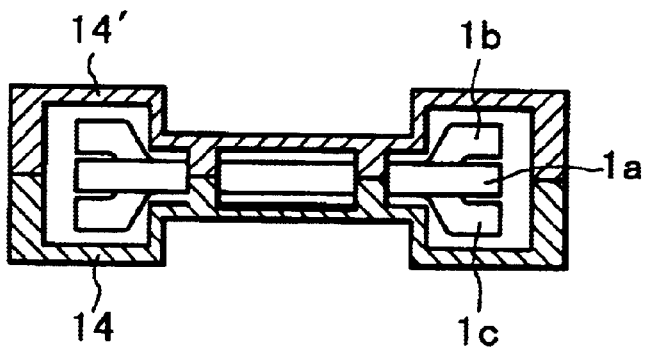
FIG. 7 is a sectional view of a jacket of a linear motor according to a third embodiment of the present invention, taken along a plane perpendicular to the driving direction.
Figure 8:
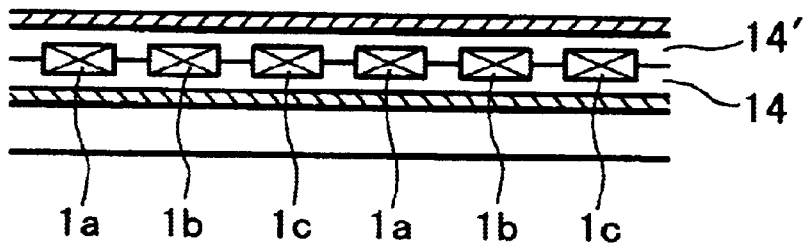
FIG. 8 is a sectional view of the linear motor of FIG. 7, taken along the driving direction.

FIG. 7 is a sectional view of a jacket of a linear motor according to a third embodiment of the present invention, taken along a plane perpendicular to the driving direction. FIG. 8 is a sectional view of the linear motor of FIG. 7, taken along the driving direction In these drawing, a magnetic circuit (permanent magnets and yokes) is not illustrated. In the first embodiment, one flat coil 1a and one bent coil 1b constitute a pair. In this embodiment, as compared therewith, one flat coil 1a and two bent coils 1b and 1c constitute one set. As shown in FIG. 8, in a region where a magnetic filed is produced by a magnetic circuit defined by permanent magnets and yokes, the coils 1a–1c are disposed laterally at the same level. Further, portions of the bent coils 1b and 1c are placed into a void core portion of the flat coil 1a. Also, as shown in FIG. 7, the bent coil 1b has its opposite end portions bent upwardly above the flat coil 1a, while the bent coil 1c has its opposite end portions bent downwardly below the flat coil 1a. In this manner, the bent coils 1b and 1c are placed into the void core portion of the flat coil 1a as described, such that like the first embodiment the gap of the space where the magnetic field is produced can be made small and, therefore, the magnetic field can be enlarged. Because of the upward and downward bent portions at the opposite ends of the bent coils 1b and 1c, the jacket elements 14 and 14' are formed with inside recessed portions corresponding to the shapes of the coils, as illustrated. The remaining portion of this embodiment has substantially the same structure and function as of the first embodiment, and substantially the same advantageous results as of the first embodiment are attainable with this embodiment.

Embodiment 4

Figure 9:
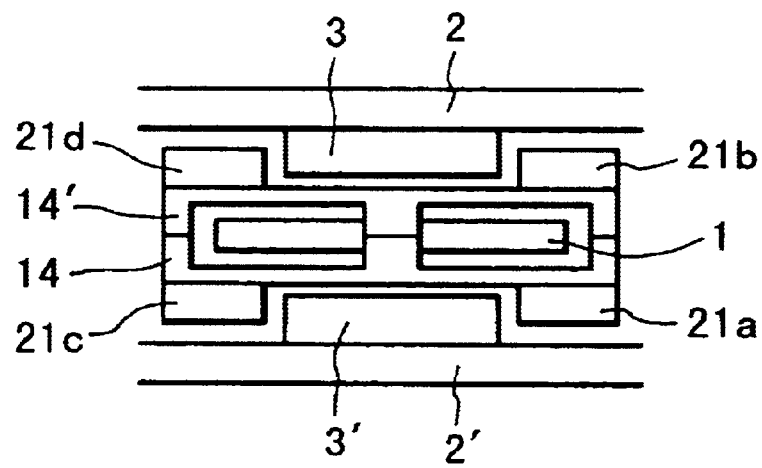
FIG. 9 is a sectional view of a linear motor according to a fourth embodiment of the present invention, taken along a plane perpendicular to the driving direction.

FIG. 9 is a sectional view of a linear motor according to a fourth embodiment of the present invention, taken along a plane perpendicular to the driving direction. Denoted in FIG. 9 at 1 is a coil, and denoted at 3 and 3' are permanent magnets for applying a magnetic field to the coil 1. Denoted at 2 and 2' are yokes on which the magnets 3 and 3' are mounted. Denoted at 14 and 14' are jacket elements, constituting a jacket, and denoted at 21a–21d are reinforcing members provided on the jacket. Since the coil 1 and the permanent magnets 3 and 3' are relatively moved along a direction perpendicular to the sheet of the drawing, the reinforcing members 21a–21d are disposed in spaces between the jacket and the yokes 2 and 2' where the magnet 3 or 3' is not present. The reinforcing members 21a–21d are fixed to the jacket by means of an adhesive agent or bolts, for example. Where bolts are used for the fixation, an adhesive material may be used to keep the seal, so as to prevent leakage of a cooling medium inside the jacket. The reinforcing members 21a–21d thus do not interfere with the drive of the linear motor, that is, relative motion of the coil 1 and the magnets 3 and 3'. As regards these reinforcing members 21a–21d, use of a non-magnetic material such as aluminum, ceramics or resin, for example, is preferable.

With the structure described above, the small-thickness portion of the jacket is reduced, such that unwanted large deformation of the small-thickness portion of the jacket due to the inside pressure of the cooling medium within the jacket, causing interference with the magnet 3 or 3' or breakage thereof, can effectively prevented. Thus, the inside pressure resistance of the jacket is improved and, therefore, the flow rate of the cooling medium can be enlarged. This directly leads to an improvement of the heat collection capacity of the cooling medium. As a result, without enlargement in size of the linear motor, the heat produced at the coil 1 when the linear motor is driven can be collected more efficiently, and adverse influences of the heat to the component mounted on the linear motor can be avoided. Particularly, when the linear motor is incorporated into a high-precision positioning system, unwanted thermal deformation of the structure or undesirable fluctuation of an air, causing an error of a laser interferometer (for position measurement) can be prevented, such that the positioning precision can be improved.

Embodiment 5

Figure 10:
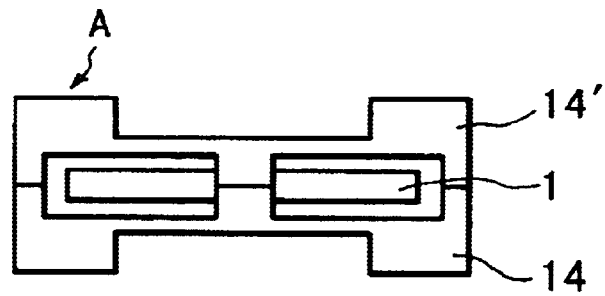
FIG. 10 is a sectional view of a linear motor according to a fifth embodiment of the present invention, taken along a plane perpendicular to the driving direction.

FIG. 10 is a sectional view of a linear motor according to a fifth embodiment of the present invention, taken along a plane perpendicular to the driving direction. Although permanent magnets and yokes are not illustrated, they are similar to those of FIG. 9. The linear motor of this embodiment corresponds to a modification of the FIG. 9 embodiment, wherein the jacket element 14 and the reinforcing members 21a and 21c, as well as the jacket element 14' and the reinforcing members 21b and 21d of FIG. 9 are combined into integral structures, respectively, having a protruded shape such as depicted at A in the drawing. Thus, the jacket elements 14 and 14' in this embodiment have such integral structures, respectively. More specifically, each of the jacket elements 14 and 14' has both of a function as a jacket and a function as a reinforcing member. As regards the jacket elements 14 and 14', use of a non-magnetic and electrically insulating material (or alternatively a high resistance material) such as ceramics or resin, for example, is preferable. With this embodiment, substantially the same advantageous results as of the fourth embodiment are attainable.

Embodiment 6

Figure 11:
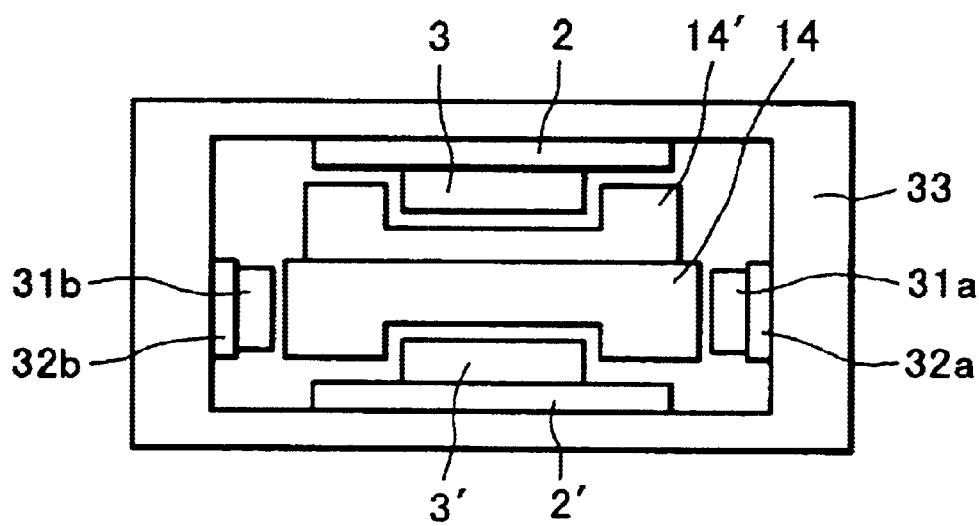
FIG. 11 is a sectional view of a linear motor according to a sixth embodiment of the present invention, taken along a plane perpendicular to the driving direction.

FIG. 11 is a sectional view of a linear motor according to a sixth embodiment of the present invention, taken along a plane perpendicular to the driving direction. In this linear motor, the jacket serves as a guide for a component to be driven by the linear motor. In FIG. 11, denoted at 31a and 31b are air pads opposed to the jacket element 14, and denoted at 32a and 32b are bases for the air pads 31a and 31b, respectively. Denoted at 33 is a member on which the yokes 2 and 2' for the magnets 3 and 3' as well as the bases 32a and 32b are mounted. Although there are coils inside the jacket elements 14 and 14', they are not illustrated. The surfaces of the jacket element 14 opposed to the air pads 31a and 31b function as guiding faces. On the other hand, the air pads 31a and 31b are arranged to discharge gaseous fluids from their surfaces facing to the jacket element 14. Thus, the air pads 31a and 31b and the jacket element 14 constitute a static pressure bearing. A gap of a few microns is maintained between the jacket element 14 and the air pad 31a or 31b, such that the jacket and the air pads are maintained out of contact and confined with respect to the lateral direction as viewed in the drawing. Although there is no confining means illustrated in relation to the longitudinal direction in the drawing, the member 33 and the like can be moved along a guide (not shown), in a direction perpendicular to the sheet of the drawing.

Embodiment 7

Figure 12:
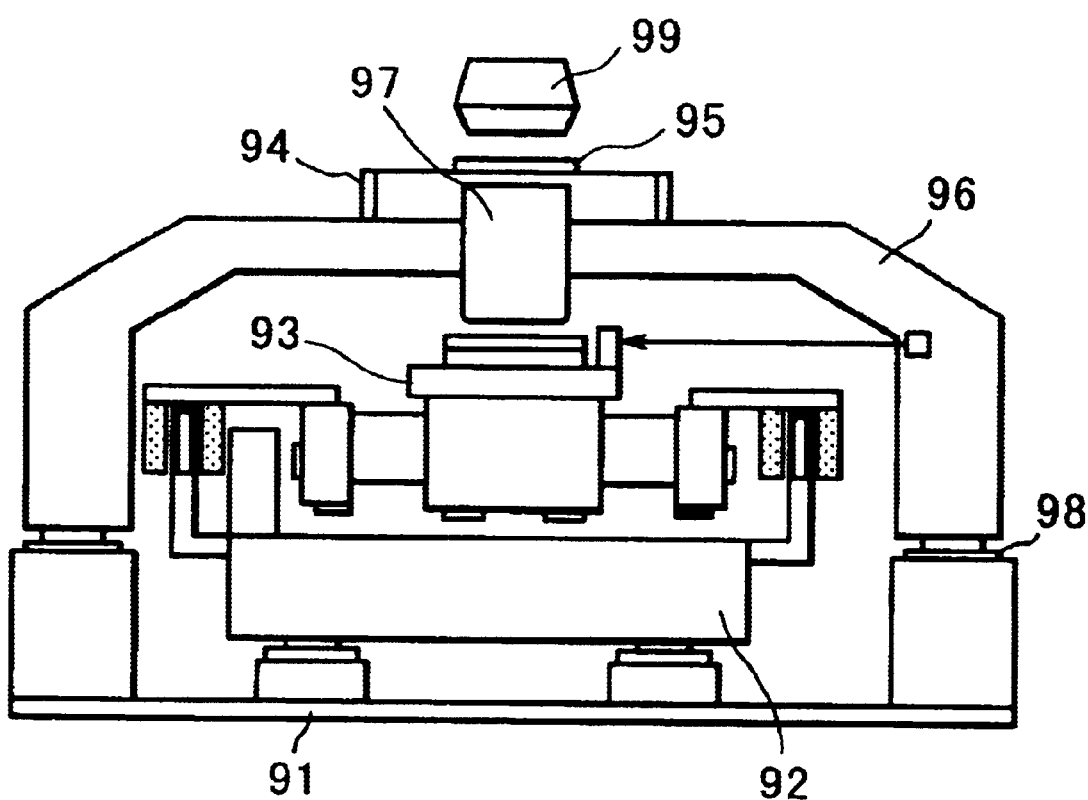
FIG. 12 is a schematic view of an exposure apparatus having a wafer stage system including a linear motor according to any one of the first to sixth embodiments.

Referring now to FIG. 12, an embodiment of a scan type exposure apparatus wherein a linear motor according to any one of the preceding embodiments is incorporated as a driving system for a wafer stage or a reticle stage, will be described.

As illustrated, a barrel base 96 is supported on a floor or a base table 91 through dampers 98. The barrel base 96 functions to support a reticle stage base 94, and also it functions to support a projection optical system 97 which is disposed between a reticle stage 95 and a wafer stage 93.

The water stage 93 is supported by a stage base which is supported by the floor or the base table, and it functions to carry a wafer thereon and to position the same. On the other hand, the reticle stage 95 is supported by a reticle stage base which is supported by the barrel base 96 The reticle stage 95 carries thereon a reticle having a circuit pattern formed thereon, and it is made movable. An illumination optical system 99 provides exposure light with which a wafer placed on the wafer stage can be exposed to the reticle.

The wafer stage 93 is scanningly moved in synchronism with the reticle stage 95. During the scan motion of the reticle stage 95 and the wafer stage 93, their positions are detected continuously by means of interferometers and the thus detected positions are fed back to driving units for the reticle stage 95 and the wafer stage 93, respectively. With this arrangement, the scan start positions of these stages can be synchronized accurately and, also, the scan speeds of them in a constant speed scan region can be controlled precisely. In the scan motion of these stages relative to the projection optical system, the wafer is exposed to the reticle pattern such that the circuit pattern is transferred to the wafer.

In this embodiment, since a linear motor according to any one of the preceding embodiments is used as a driving unit for the stage system, the cooling efficiency of the linear motor is high. The heat produced by the coil can be collected efficiently. Therefore, the structure effectively prevents the heat generated at the linear motor from being transmitted to the wafer stage 93 or the reticle stage 95 to cause a temperature rise thereof or a temperature rise of the ambience of the stage. As a result, the positioning precision of the wafer stage 93 can be improved significantly, and finally, a high precision pattern transfer operation can be accomplished.

Embodiment 8

Figure 13:
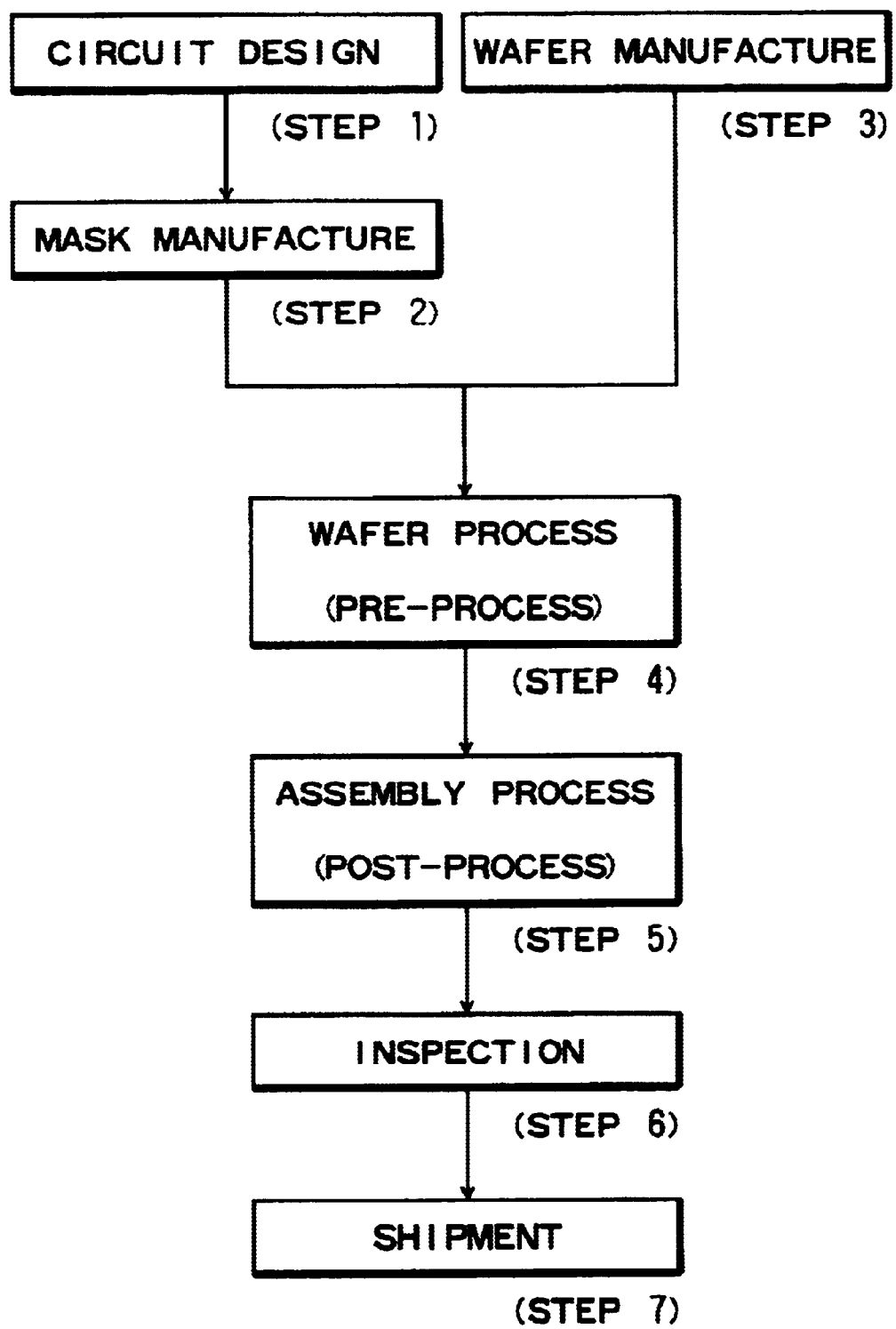
FIG. 13 is a flow chart of semiconductor device manufacturing processes, using an exposure apparatus according to the present invention.

FIG. 13 is a flow chart of procedure for manufacture of microdevices such as semiconductor chips (e.g. ICs or LSIs), liquid crystal panels, or CCDs, for example, using an exposure apparatus such as described above.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 14:
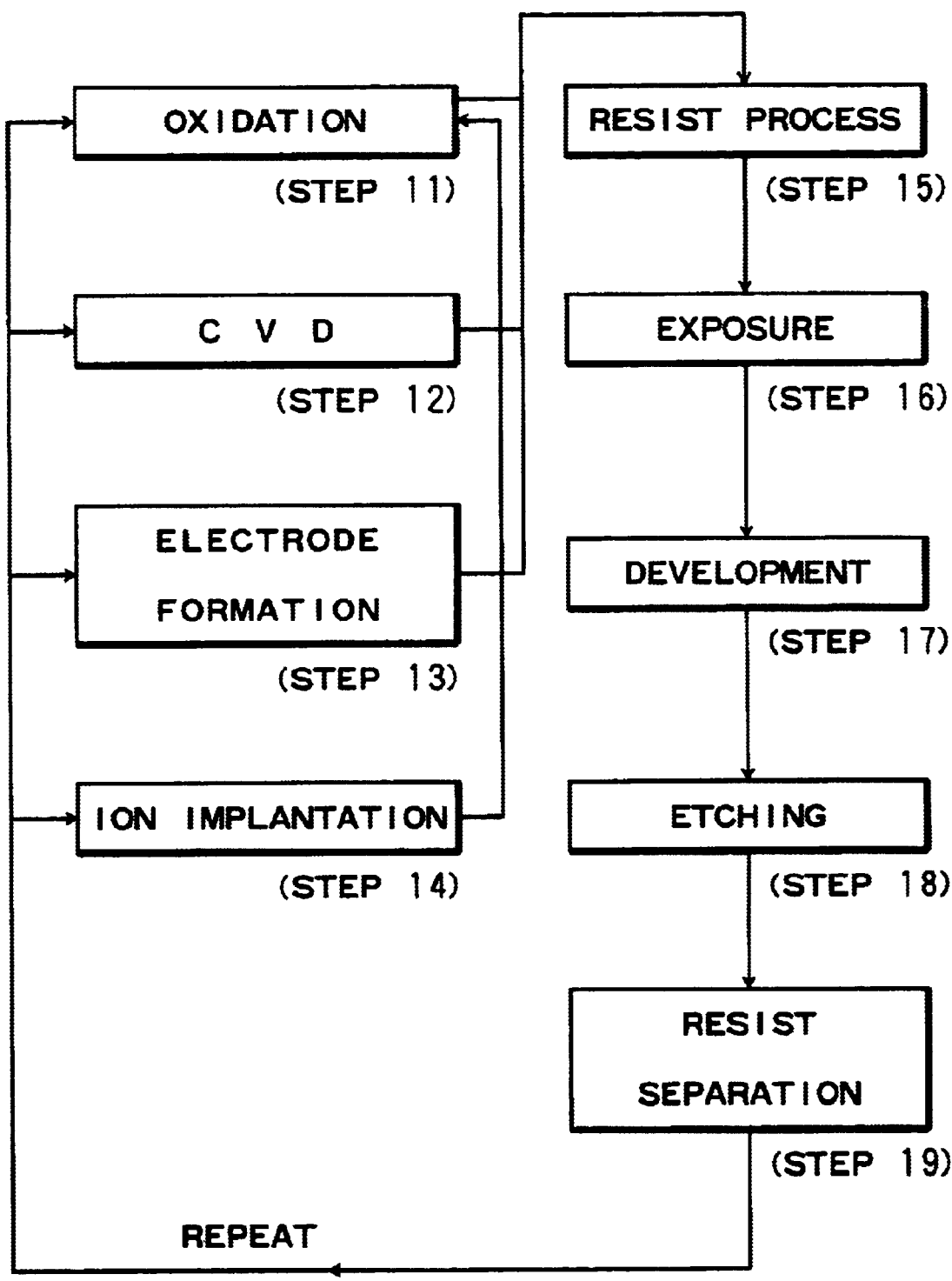
FIG. 14 is a flow chart for explaining details of a wafer process included in the procedure of FIG. 13.
Figure 15:
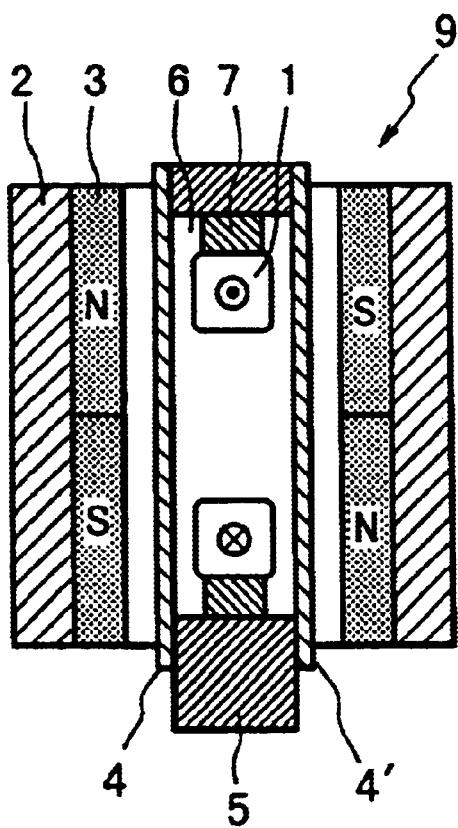
FIG. 15 is a sectional view of a structure of a conventional linear motor with cooling means.
Figure 16:
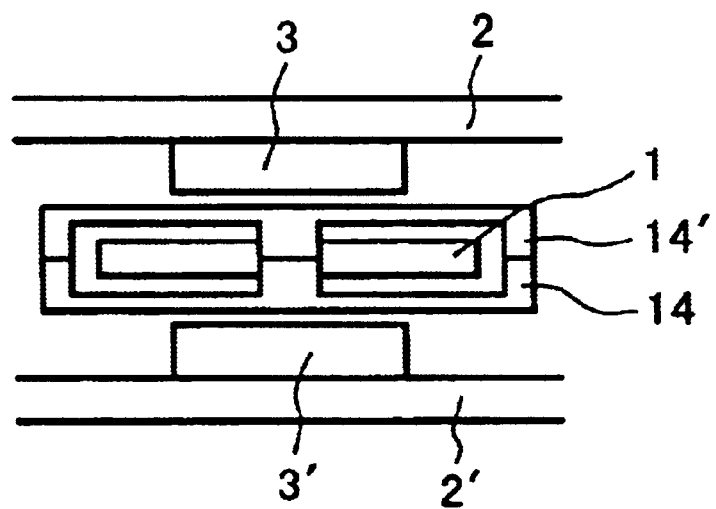
FIG. 16 is a sectional view of another example of a conventional linear motor.

FIG. 14 is a flow chart showing details of the wafer process (step 4).

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In a linear motor according to the present invention, it is provided with a predetermined comb-shaped member or a reinforcement member extending in parallel to the driving direction. With this structure, even if the pressure of a cooling medium is made larger or the thickness of a small-thickness portion of the jacket is made smaller, unwanted deformation or breakage of the jacket can be prevented. Therefore, the flow rate of the cooling medium can be increased to improve the cooling efficiency. Reduction in size of the jacket and enlargement of the output thrust of the linear motor can be accomplished effectively.

The provision of the comb-shaped member or the reinforcement member is effective to increase the natural frequency of the jacket, such that a precise driving operation is assured. Therefore, in accordance with a stage system, an exposure apparatus or a device manufacturing method of the present invention, more efficient and precise stage motion, exposure operation and device manufacture are accomplished.

While the invention has been described with reference to the structures disclosed herein, it is not confined to the details set forth and this application is intended to cover such modifications or changes as may come within the purposes of the improvements or the scope of the following claims.

What is claimed is:

1. A linear motor, comprising:
   a magnet;
   a plurality of coils; and
   a jacket having a comb-shaped member that extends along a driving direction, wherein a cooling medium flows through an inside space enclosed by said jacket, wherein said comb-shaped member includes base portions provided on inside faces of said jacket and pillar-like portions for connecting said base portions, and wherein at least one of said plurality of coils is supported by said base portions in a floating manner and is fixed, with respect to the driving direction, by being sandwiched by the pillar-like portions,
   wherein said a plurality of coils are arrayed along the driving direction partially overlapping each other wherein at least one of said coils has a bent end portion to avoid mutual interference of partially overlapped portions of said coils and wherein said coils are disposed with their central portions placed substantially at the same level, and
   wherein said jacket has a central portion and a recessed portion on the outside of the central portion, wherein the bent end portions of said coils are disposed at the recessed portion, and wherein the recessed portion reinforces the central portion.

2. A linear motor according to claim 1, wherein said jacket serves as a guide for an element to be driven by said linear motor.

3. A stage system, comprising:
   a linear motor as recited in claim 1; and
   a stage to be driven by said linear motor.

4. An exposure apparatus, comprising:
   a stage system as recited in claim 3; and
   an optical system for illuminating a substrate to be conveyed by said stage system.

5. A device manufacturing method, comprising the steps of:
   applying a photosensitive material to a substrate;

exposing the substrate by use of an exposure apparatus as recited in claim 4; and developing the exposed substrate.

6. A linear motor comprising:

a magnet;

a coil; and a jacket having a comb-shaped member that extends along a driving direction, wherein a cooling medium flows through an inside space enclosed by said jacket, wherein said comb-shaped member includes base portions provided on inside faces of said jacket and pillar-like portions for connecting said base portions, and wherein said coil is supported by said base portions in a floating manner and is fixed, with respect to the driving direction, by being sandwiched by the pillar-like portions, wherein said jacket has a reinforcement portion extending parallel to the driving direction, and wherein said reinforcement portion is formed on an outside face of said jacket.

7. A linear motor according to claim 6, wherein said reinforcement portion is formed at a position not interfering with relative motion of said magnet and said coil.

8. A linear motor according to claim 6, wherein said reinforcement portion is made of one of aluminum, ceramics and resin.

9. A linear motor according to claim 6, wherein said reinforcement portion is made integral with said jacket, and wherein said reinforcement portion is defined by a portion having a protruded shape with respect to a portion of said jacket where said magnet and said coil are opposed to each other.

10. A linear motor according to claim 9, wherein said jacket and said reinforcement portion, being integral with each other, are made of one of ceramics and resin.

11. A linear motor according to claim 9, wherein the protruded shape portion of said jacket is spaced from said coil.

12. A linear motor comprising:

a magnet;

a coil; and a jacket having a comb-shaped member that extends along a driving direction, wherein a cooling medium flows through an inside space enclosed by said jacket, wherein said comb-shaped member includes base portions provided on inside faces of said jacket and pillar-like portions for connecting said base portions, and wherein said coil is supported by said base portions in a floating manner and is fixed, with respect to the driving direction, by being sandwiched by the pillar-like portions, wherein said jacket has a reinforcement portion extending parallel to the driving direction, and wherein at least one of an upper half and a lower half of a section of said jacket taken along a plane perpendicular to the driving direction has a recessed portion.

13. A linear motor, comprising:

a magnet;

a plurality of coils; and a coil holding member having recessed portions and pillar portions, in a comb-shape, disposed along a first direction, wherein each coil is supported, with respect to a second direction perpendicular to the first direction, by the recessed portions and is fixed, with respect to the first direction, by being sandwiched by the pillar portions, the pillar portions being disposed along an outside periphery of said coils.

14. A linear motor according to claim 13, wherein each coil has an inside void in which a portion of another coil is placed.

15. A linear motor according to claim 13, wherein each coil has an inside void in which plural pillar portions of said coil holding member are disposed along the first direction.

16. A linear motor according to claim 13, wherein said coil holding member surrounds said coil, and wherein a temperature controlling medium is supplied into said coil holding member.

17. A stage system, comprising:

a linear motor as recited in claim 13; and a stage to be driven by said linear motor.

18. An exposure apparatus, comprising:

a stage system as recited in claim 17; and an optical system for illuminating a substrate to be conveyed by said stage system.

19. A device manufacturing method, comprising the steps of:

applying a photosensitive material to a substrate;

exposing the substrate by use of an exposure apparatus as recited in claim 18; and developing the exposed substrate.

20. A linear motor according to claim 13, wherein said coil holding member serves as a guide for an element to be driven by said linear motor.

21. A linear motor according to claim 13, wherein said coil holding member has a reinforcement portion extending in parallel to the first direction.

22. A linear motor according to claim 21, wherein said reinforcement portion is formed on an outside face of said coil holding member.

* * * * *

UNITED STATES PATENT AND TRADEMARK OFFICE
CERTIFICATE OF CORRECTION

PATENT NO.    : 6,639,333 B1
DATED         : October 28, 2003
INVENTOR(S)   : Shigeto Kamata et al.

It is certified that error appears in the above-identified patent and that said Letters Patent is hereby corrected as shown below:

Column 1,
Line 14, "an" should read -- a --.

Column 4,
Line 9, "in" should be deleted.

Column 7,
Line 2, "filed" should read -- field --.

Signed and Sealed this

Sixteenth Day of March, 2004

JON W. DUDAS
*Acting Director of the United States Patent and Trademark Office*